(12) United States Patent
Ahmad et al.

(10) Patent No.: US 6,858,507 B2
(45) Date of Patent: Feb. 22, 2005

(54) GRADED LDD IMPLANT PROCESS FOR SUB-HALF-MICRON MOS DEVICES

(75) Inventors: Aftab Ahmad, Boise, ID (US); Charles Dennison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 10/198,941

(22) Filed: Jul. 19, 2002

(65) Prior Publication Data

US 2002/0182813 A1 Dec. 5, 2002

Related U.S. Application Data

(60) Continuation of application No. 09/649,246, filed on Aug. 28, 2000, now Pat. No. 6,448,141, which is a continuation of application No. 08/819,172, filed on Mar. 17, 1997, now Pat. No. 6,159,813, which is a division of application No. 08/539,385, filed on Oct. 5, 1995, now Pat. No. 5,719,424.

(51) Int. Cl.[7] .............................................. H01L 21/336
(52) U.S. Cl. ....................... 438/303; 438/305; 438/307; 438/595
(58) Field of Search ................................ 438/197, 299, 438/301, 303, 305, 306, 307, 529, 585, 595

(56) References Cited

U.S. PATENT DOCUMENTS

| 4,939,386 A | 7/1990 | Shibata et al. |
|---|---|---|
| 4,949,136 A | 8/1990 | Jain |
| 5,021,851 A | 6/1991 | Haken et al. |
| 5,217,910 A | 6/1993 | Shimizu et al. |
| 5,218,221 A | 6/1993 | Okumura |
| 5,376,566 A | 12/1994 | Gonzalez |
| 5,716,862 A | 2/1998 | Ahmad et al. |
| 5,719,424 A | 2/1998 | Ahmad et al. |
| 5,726,479 A | 3/1998 | Matsumoto et al. |
| 5,770,505 A | 6/1998 | Om et al. |
| 6,046,472 A | 4/2000 | Ahmad et al. |
| 6,159,813 A | 12/2000 | Ahmad et al. |
| 6,448,141 B1 * | 9/2002 | Ahmad et al. ............... 438/303 |

FOREIGN PATENT DOCUMENTS

| JP | 6-13401 | 1/1994 |
|---|---|---|
| JP | 6-132489 | 5/1994 |
| WO | WO94/19830 | 9/1994 |

OTHER PUBLICATIONS

"Silicon Processing for the VLSI Era"—vol. II, Process Integration, Lattice Press 1990, pp. 428–441.

* cited by examiner

Primary Examiner—Jack Chen
(74) Attorney, Agent, or Firm—TraskBritt

(57) ABSTRACT

A process for grading the junctions of a lightly doped drain (LDD) N-channel MOSFET by performing a low dosage phosphorous implant after low and high dosage arsenic implants have been performed during the creation of the N-LDD regions and N+ source and drain electrodes. The phosphorous implant is driven to diffuse across both the electrode/LDD junctions and the LDD/channel junctions.

16 Claims, 5 Drawing Sheets

GRADED LDD IMPLANT PROCESS FOR SUB-HALF-MICRON MOS DEVICES

CROSS-REFERENCE TO RELATED APPLICATIONS

This application is a continuation of application Ser. No. 09/649,246, filed Aug. 28, 2000, now U.S. Pat. No. 6,448,141 B1, issued Sep. 10, 2002, which is a continuation of application Ser. No. 08/819,172 filed Mar. 17, 1997, now U.S. Pat. No. 6,159,813, issued Dec. 12, 2000, which is a divisional of application Ser. No. 08/539,385, filed Oct. 5, 1995, now U.S. Pat. No. 5,719,424, issued Feb. 17, 1998.

This invention was made with Government support under Contract No. MDA972-92-C-0054 awarded by Advanced Research Projects Agency (ARPA). The Government has certain rights in this invention.

BACKGROUND OF THE INVENTION

1. Field of the Invention

This invention relates to semiconductor integrated circuit fabrication and, more particularly, to improved processes for fabricating MOS field effect transistors having graded lightly doped drain and source regions.

2. State of the Art

Semiconductor integrated circuits are comprised of a plurality of devices which invariably include transistors. Transistors are of two general types, namely bipolar and field effect transistors (FETs).

FIG. 1 shows the common type of FET structure generally used to form metal oxide substrate (MOS) type circuits. In this case, an N-channel MOS FET (NMOSFET) structure comprises a substrate 1 of semiconducting material such as silicon having a region which has been doped to form a "P-well" 2. A detailed description of this process may be found in "Silicon Processing For The VLSI Era"—Volume 2, Process Integration, Lattice Press 1990, pp 428–441. An active area 3 is defined between isolating field oxide regions 4 and 5. A gate region 6 of conductive material such as polysilicon (poly) is separated from the surface by a layer 7 of dielectric material such as silicon dioxide ($SiO_2$). Conductive interconnect material 8 such as tungsten silicide is formed above and in contact with the gate region which interconnects the gate to other circuit devices. Implanted into the surface of the P-well 2 astride the gate region 6 are source region 9 and drain region 10 of N type semiconductor material with the FET channel area 11 formed in between. A cap layer 12 and sidewall spacer structures 13 of insulating material such as nitride protect the gate structures during subsequent processing such as the self aligned implants of the source and drain regions and the formation of conductive structures which interconnect these regions.

MOSFETs in combination with other devices commonly form dynamic random access memory circuits (DRAM) used in memory systems such as computers. Because of the continuous demand for the further miniaturization and speed increase of DRAMs, MOSFET devices have been scaled to the point where the channel length from source to drain falls below 0.5 micron (sub-half micron). As the channel shrinks, the maximum electric field (E-field) in the channel region increases, thereby resulting in higher substrate current and short/long term hot electron reliability problems. Electrons traveling through the channel become more energized by the E-field and have a greater tendency to cross into the gate region 6 and become trapped. These problems are discussed in detail in "Silicon Processing For The VLSI Era-Volume 2,"Lattice Press, 1990, pp 428–441.

The reference cited above also discusses various methods employed to partially overcome these problems and maximize performance and reliability. One common method involves adding a first lightly doped region between the drain and channel regions and a second lightly doped region between the source and channel regions. FIGS. 2 and 3 show the typical fabrication sequence for this structure. In FIG. 2, after formation of the insulating sidewall spacer structures 13, a low dosage phosphorous implant and drive create N-regions 14, 15. Due to the relatively high diffusivity of phosphorous, the N-regions extend underneath the spacers toward the FET channel area 11. In FIG. 3, a high dosage arsenic implant and drive creates N+ source 16 and drain 17 regions which supersede most of the lightly doped N-regions. What remains are lightly doped regions 18, 19 separating the source and drain from the channel. This structure has come to be known as a lightly doped drain (LDD) structure. The use of LDD structures to relax the E-field is well known.

However, as the devices get smaller, and FET channels become shorter than 0.4 microns, limitations on fabrication precision result in structures that are far from the ideal one shown in FIG. 3. Due to its high diffusivity, the phosphorous in the N-regions further diffuses into the channel during the high heat drive processes required to create the N+ source and drain regions. This causes severe short channel problems resulting in increased sub-threshold leakage which adversely affects refresh time in DRAMs.

An alternative to the phosphorous LDD (phos-LDD) approach is to use arsenic to create the LDD structures as proposed by H. R. Grinolds, et al. in "Reliability and Performance of Submicron LDD NMOSFET's with Buried-As n-Impurity Profiles," IEDM Tech. Dig., 1985, pp. 246–249 and by C.-Y. Wei, et al. in "Buried and Graded/Buried LDD Structures for Improved Hot-Electron Reliability," IEEE Electron Device Lett., vol. EDL-7, np. Jun. 6, 1986.

The fabrication processes required to create an arsenic LDD (As-LDD) proceed similarly to the phosphorous LDD processes. FIGS. 4 and 5 show that an LDD structure can be created by first implanting a low dosage, self-aligned arsenic implant prior to sidewall spacer formation. This implant is then diffused into the substrate through a heating drive process, resulting in the lightly doped N-regions 20 and 21.

In FIG. 5, after the formation of insulating sidewall spacer structures 13, the N+ source 22 and drain 23 regions are created using a high dosage, self-aligned arsenic implant and drive. The N+ regions supplant portions of the N-regions. There remains, however, a first lightly doped N-LDD region 24 existing between the N+ source region 22 and the FET channel area 11, and a second lightly doped N-LDD region 25 existing between the N+ drain region 23 and the FET channel area 11.

Since low diffusivity arsenic was used to create the N-LDD regions, the resulting LDD structures are much more predictable and do not suffer from the short channel problems plaguing phosphorous LDD structures. However, arsenic's low diffusivity also causes the N-LDD regions 24, 25 to have an abrupt end 26, 27 below the edges of the gate region 6. This abruptness creates an E-field which is still unsuitable in sub half-micron devices due to the resulting hot electron reliability problem.

To alleviate this problem, a combination phos/As LDD structure has been developed where a phos-LDD implant occurs immediately after an As-LDD implant to grade the channel to LDD junction. Again, due to the diffusivity of phosphorous, during subsequent processing, the short channel characteristics are degraded.

Another method to reduce the E-field involves burying the drain/channel and source/channel junctions. FIG. 6 shows an NMOSFET having buried drain/channel and source/channel junctions. In this FET, the N+ source and drain regions 28, 29 each have a projection 30, 31 which terminates at a junction 32, 33 with the FET channel area 11. The projections exist a distance below the channel/gate dielectric material layer 7. This moves the highest concentration of hot-electrons deeper into the channel area and away from the gate dielectric region. Buried structures incorporating LDD regions and graded combination structures have also been created, but at the expense of device speed. Although these structures offer promise, they are quite costly to construct and, therefore, not currently viable solutions, economically.

It would be desirable, therefore, to have a process which produces a sub half-micron MOSFET with a low E-field and improved short channel characteristics and reliability in an efficient and economical manner.

BRIEF SUMMARY OF THE INVENTION

The primary and secondary objects of this invention are to provide a process for creating reliable and inexpensive sub-half-micron NMOSFETs.

These and other objects are achieved by a process wherein a low dosage N-phosphorous implant occurs after the high dosage N+ arsenic implant and drive which creates the source and drain.

DETAILED DESCRIPTION OF THE INVENTION

Figure 1:
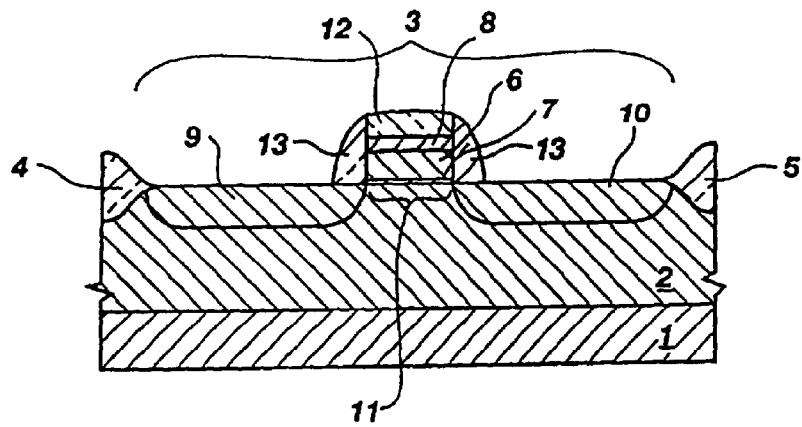
FIG. 1 is a prior art cross-sectional view of a MOSFET having non-graded source and drain electrodes.
Figure 2:
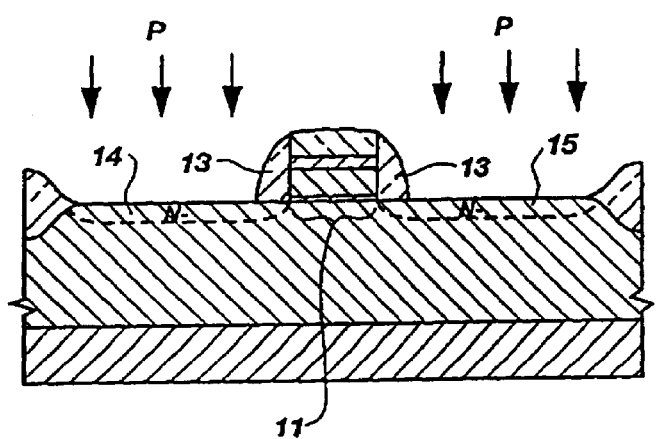
FIG. 2 is a prior art cross-sectional view of an in-process NMOSFET during a low dosage phosphorous implant of a pair of N-LDD structures.
Figure 3:
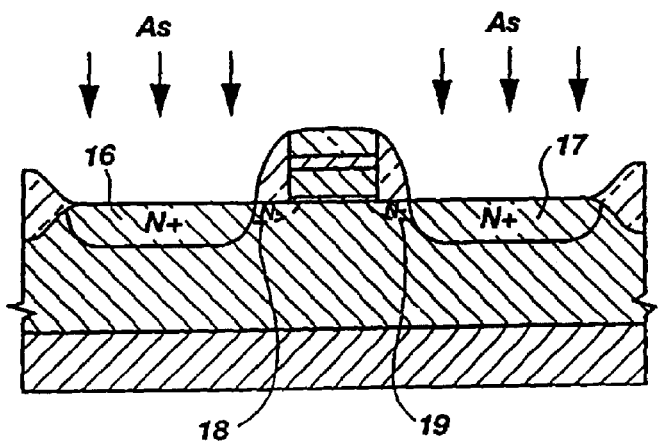
FIG. 3 is a prior art cross-sectional view of the in-process NMOSFET of FIG. 2 during a high dosage arsenic implant to create N+ source and drain regions.
Figure 4:
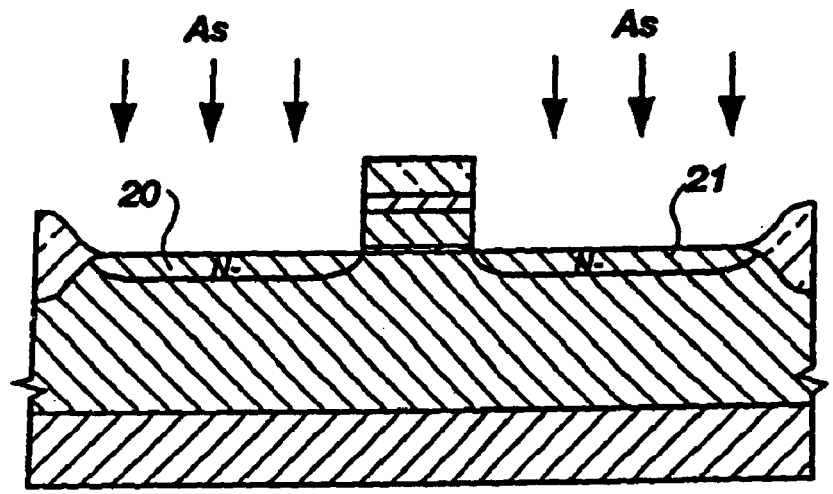
FIG. 4 is a prior art cross-sectional view of an in-process NMOSFET during a low dosage arsenic implant of a pair of N-LDD structures.
Figure 5:
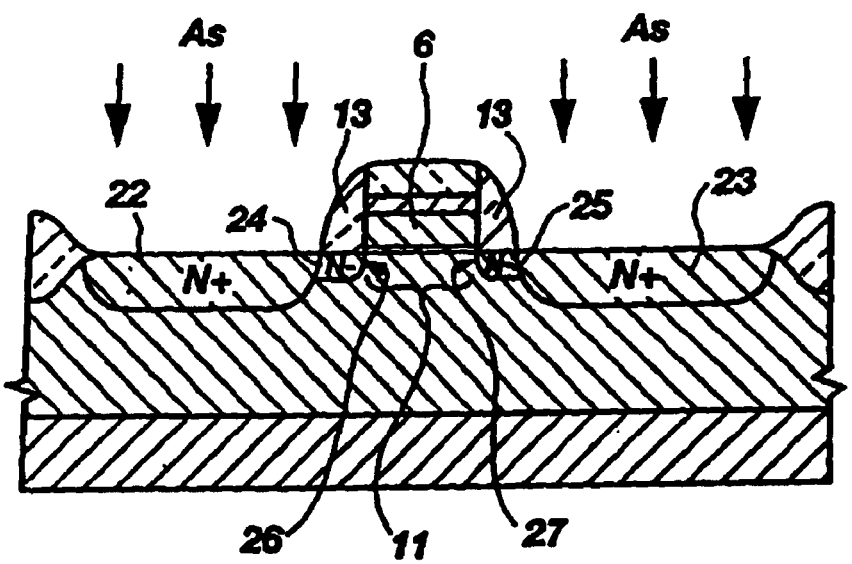
FIG. 5 is a prior art cross-sectional view of the in-process NMOSFET of FIG. 4 during a high dosage arsenic implant to create N+ source and drain structures.
Figure 6:
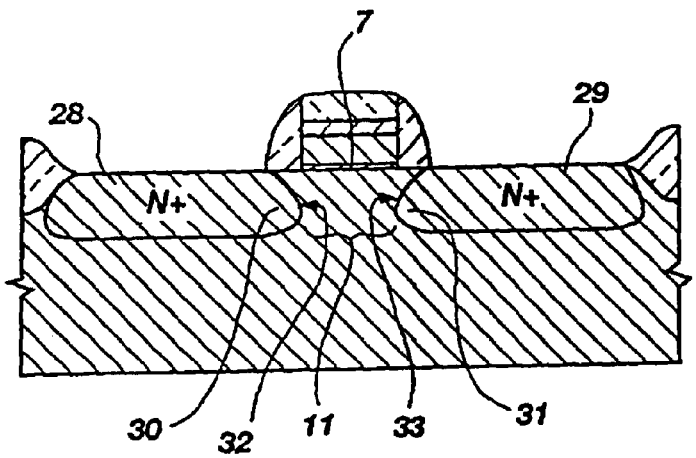
FIG. 6 is a prior art cross-sectional view of a MOSFET having buried source and drain regions.
Figure 7:
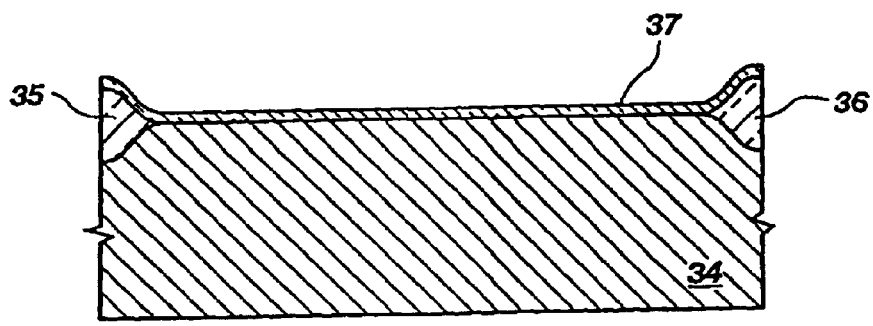
FIG. 7 is a cross-sectional view of an in-process NMOSFET using the invention after field oxide deposition, active area definition, sacrificial oxide deposition and threshold adjustment implantation.

Referring now to the drawings, FIG. 7 shows a cross-section of a silicon substrate 34 doped to form a "P-well" upon which an active area has been defined between implanted field oxide regions 35, 36 and below a sacrificial oxide layer 37. A threshold voltage adjustment implant may also be performed at this stage.

Figure 8:
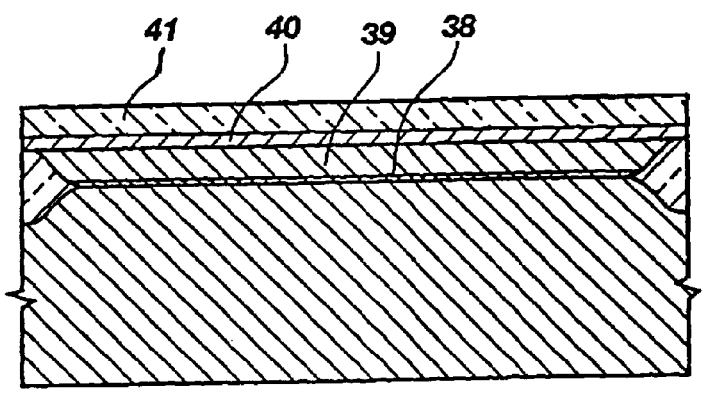
FIG. 8 is a cross-sectional view of the in-process NMOSFET of FIG. 7 after removal of the sacrificial oxide, growth of a gate oxide layer and deposition of several layers of gate forming materials.

After the sacrificial oxide layer is removed, FIG. 8 shows that a gate oxide layer 38 is grown. Atop the gate oxide layer, a conductive layer of polysilicon ("poly") 39 is deposited. Atop the poly is a more conductive tungsten silicide ($WSi_x$) interconnect layer 40 and atop this layer is a protective and insulating nitride layer 41.

Figure 9:
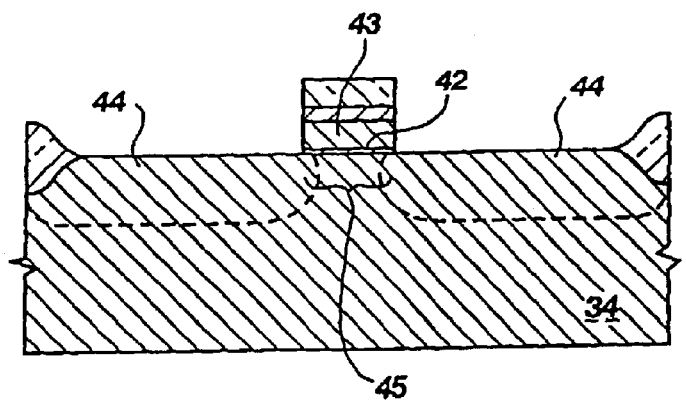
FIG. 9 is a cross-sectional view of the in-process NMOSFET of FIG. 8 after a gate defining mask and etch process.

A gate definition etch is performed resulting in the structure of FIG. 9. A gate dielectric oxide region 42 separates a poly gate region 43 from the silicon substrate 34. A boron halo implant 44 is then performed to optimize the concentration of p-type charge carriers in areas of the substrate outside the channel area 45.

Figure 10:
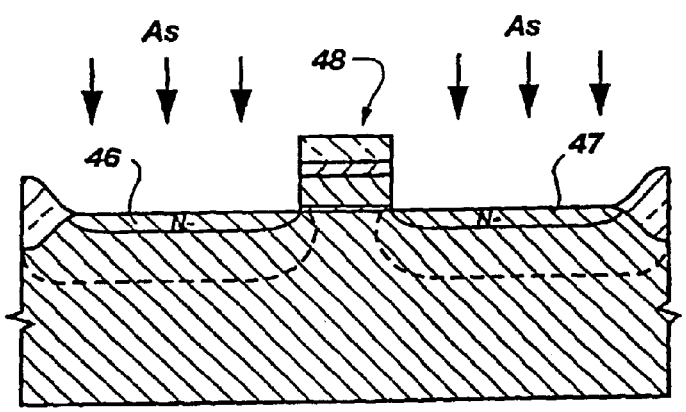
FIG. 10 is a cross-sectional view of the in-process NMOSFET of FIG. 9 after a low dosage arsenic implant to form N-LDD regions.

In FIG. 10, a low dosage arsenic implant and drive creates N-LDD regions 46, 47 on either side of the channel. The gate structure 48 itself protects the channel from both the boron halo and arsenic implants.

Figure 11:
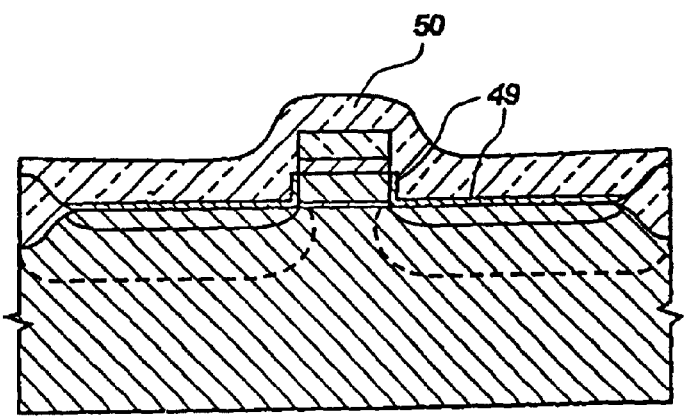
FIG. 11 is a cross-sectional view of the in-process NMOSFET of FIG. 10 after gate sidewall oxide growth and deposition of a layer of nitride.

Next, in FIG. 11, a thin (60 to 120 angstroms) layer of oxide 49 is grown on the poly gate sidewalls and the exposed surfaces of the LDD regions to further protect the gate during the subsequent blanket deposition of an insulating layer of nitride 50.

Figure 12:
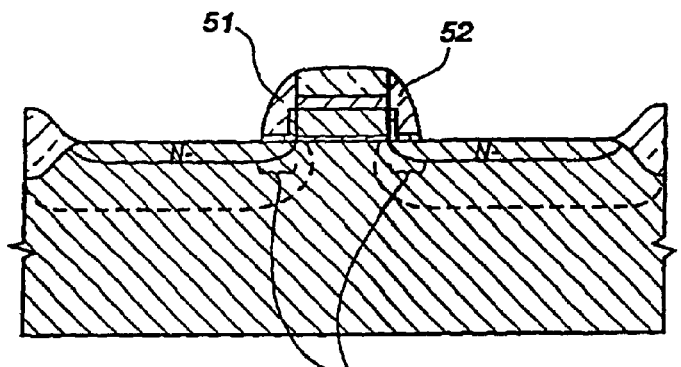
FIG. 12 is a cross-sectional view of the in-process NMOSFET of FIG. 11 after a sidewall spacer creating etch.

FIG. 12 shows the in-process MOSFET after an anisotropic etch is performed to remove the horizontal portions of the spacer nitride layer thereby leaving nitride sidewall spacers 51, 52. The thin oxide layer has also been removed from those portions of the active area left unprotected by the nitride structures. The spacers cover over a portion 53 of each As-LDD region implanted earlier.

Figure 13:
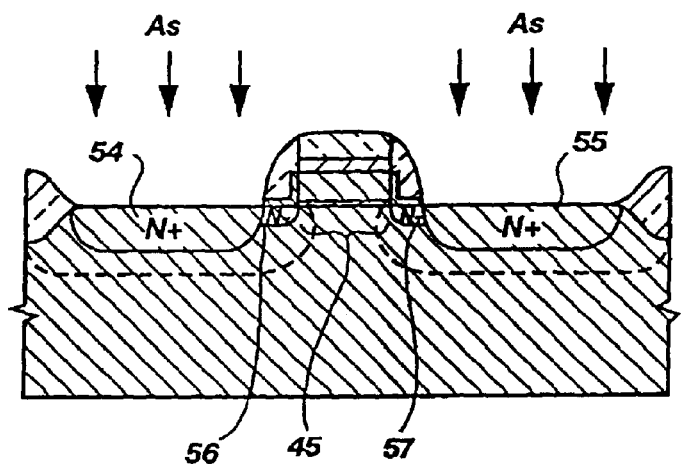
FIG. 13 is a cross-sectional view of the in-process NMOSFET of FIG. 12 after a high dosage arsenic implant to create N+ source and drain regions.

FIG. 13 shows the result of a high dosage arsenic implant and drive to create N+ source 54 and N+ drain 55 regions of the MOSFET. Note the adjacent low dosage N-As-LDD regions 56, 57 separating the N+ regions from the channel area 45.

Figure 14:
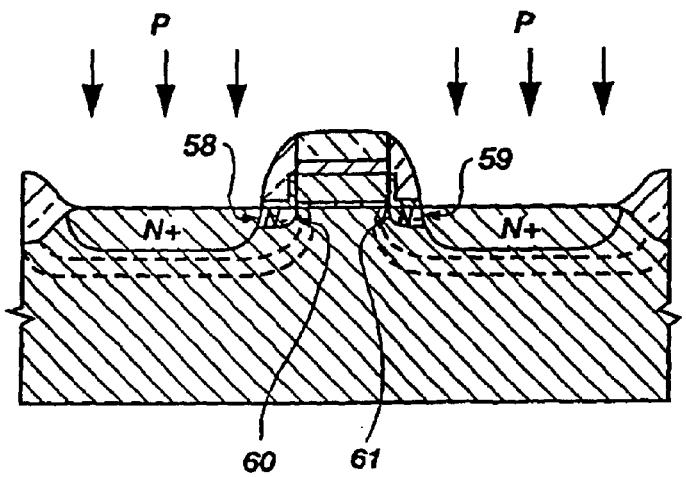
FIG. 14 is a cross-sectional view of the in-process NMOSFET of FIG. 13 after a low dosage phosphorous implant to grade both the N+/N− and the N−/channel junctions.

Next, as seen in FIG. 14, a low dosage phosphorous implant and drive is performed to grade both the junctions 58, 59 between the N+ and N-arsenic LDD regions and the junctions 60, 61 between N-arsenic LDD regions and the channel. The major problem with phosphorus (i.e., its high diffusivity) has been side-stepped by implanting after the high heat, high dosage implant and drive which creates the N+ source and drain regions.

Further steps to realize the completed MOSFET involve steps familiar in the art such as the deposition of a layer of boro-phospho-silicate glass (BPSG), reflow and formation of conductive contacts to the source and drains.

The finished MOSFET exhibits a reduced E-field due to the phosphorous grading of the junctions. Since the phosphorous is implanted late in processing, its diffusive nature is more controlled, allowing for a reliable sub-half-micron device. The elimination of numerous steps, along with the self-aligned nature of the existing steps, results in achieving the previously economically unfeasible sub-half-micron MOSFET.

Another advantage is that the phosphorous implant after the source/drain formation allows grades in the junction between the N+ regions and the boron halo implant, resulting in reduced junction leakage and less N+ junction capacitance.

A possible disadvantage to this scheme involves the addition of a mask to protect in-process devices located on other areas of the wafer during this low-dosage phosphorous implant. A typical area sensitive to phosphorous would be the array on an in-process DRAM chip where field oxide regions are narrow. However, in processes where the spacer etch is performed after the cell poly etch, the array will not be exposed because it is still covered with photoresist at that point. In this case, no extra mask would be required.

While the preferred embodiments of the invention have been described, modifications can be made and other embodiments may be devised without departing from the spirit of the invention and the scope of the appended claims.

What is claimed is:

1. A method for forming an NMOSFET on a semiconductor substrate, said NMOSFET having at least one graded LDD source region and at least one graded LDD drain region separated by a channel, said method comprising:
   providing a gate structure on said semiconductor substrate, said gate structure including gate sidewalls;
   implanting said semiconductor substrate with a first dosage N type conductivity-altering material creating a lightly doped source region formed on one side of said channel and a lightly doped drain region formed on another side of said channel;
   growing an oxide layer on at least a portion of said gate sidewalls of said gate structure and an exposed surface of an area of said semiconductor substrate;
   forming sidewall spacers abutting said gate structure covering portions of said first dosage implanted semiconductor substrate and said oxide layer on at least a portion of said gate sidewalls of said gate structure and said exposed surface of said area of said semiconductor substrate;
   implanting said semiconductor substrate with a second dosage N type conductivity-altering material to create a heavily doped source region and a heavily doped drain region flanking said gate structure, said heavily doped source and drain regions supplanting respective uncovered portions of said lightly doped source and drain regions, said second dosage N type conductivity-altering material being a greater dosage than said first dosage N type conductivity-altering material; and
   implanting said semiconductor substrate with a third dosage N type conductivity-altering material grading said heavily doped source and drain regions and remaining portions of
   said lightly doped source and drain regions, said third dosage N type conductivity-altering material being a lesser dosage than said second dosage N type conductivity-altering material.

2. The method of claim 1, wherein said remaining portions of said lightly doped source and drain regions are each located adjacent to and opposite said channel.

3. The method of claim 2, wherein said third dosage N type conductivity-altering material has greater diffusivity than said first dosage N type conductivity-altering material and said second dosage N type conductivity-altering material.

4. The method of claim 3, wherein said first dosage N type conductivity-altering material includes arsenic.

5. The method of claim 3, wherein said second dosage N type conductivity-altering material includes arsenic.

6. The method of claim 3, wherein said third dosage N type conductivity-altering material includes phosphorous.

7. A method for forming a NMOSFET on a semiconductor substrate, said NMOSFET having at least one graded LDD source region and at least one graded LDD drain region separated by a channel, said method comprising:
   providing a gate structure on said semiconductor substrate, said gate structure including gate oxide, conductive polysilicon, and gate sidewalls;
   implanting said semiconductor substrate with a first dosage conductivity-altering material creating a lightly doped source region on one side of said channel and a lightly doped drain region on another side of said channel;
   growing an oxide layer on said gate oxide and conductive polysilicon portions of said gate sidewalls of said gate structure and an exposed surface of an area of said semiconductor substrate;
   forming sidewall spacers abutting at least portions of said gate structure covering portions of said first dosage implanted semiconductor substrate and said oxide layer on said gate oxide and conductive polysilicon portions of said gate sidewalls of said gate structure and said exposed surface of said area of said semiconductor substrate;
   implanting said semiconductor substrate with a second dosage conductivity-altering material to create a heavily doped source region and a heavily doped drain region flanking said gate structure, said heavily doped source and drain regions supplanting respective uncovered portions of said lightly doped source and drain regions, said second dosage conductivity-altering material being a greater dosage than said first dosage conductivity-altering material; and
   implanting said semiconductor substrate with a third dosage conductivity-altering material to grade said heavily doped source and drain regions and remaining portions of said lightly doped source and drain regions.

8. The method of claim 7, wherein said remaining portions of said lightly doped source and drain regions are each adjacent and opposite said channel.

9. The method of claim 8, wherein said third dosage conductivity-altering material has greater diffusivity than said first dosage conductivity-altering material and said second dosage conductivity-altering material.

10. The method of claim 7, wherein implanting a first dosage conductivity-altering material, implanting a second dosage conductivity-altering material, and implanting a third dosage conductivity-altering material are each self-aligning.

11. A method for forming a graded LDD region on a semiconductor substrate, said method comprising:
   providing a gate structure on said semiconductor substrate, said gate structure including gate sidewalls;
   implanting said semiconductor substrate with a first dosage N type conductivity-altering material creating a first lightly doped region;
   growing an oxide layer on at least a portion of said gate sidewalls of said gate structure and an exposed surface of an area of said semiconductor substrate;

forming a sidewall spacer substantially abutting said gate structure covering a portion of said first dosage implanted semiconductor substrate and said oxide layer on at least a portion of said gate sidewalls of said gate structure and said exposed surface of said area of said semiconductor substrate;

implanting said semiconductor substrate with a second dosage N type conductivity-altering material creating a heavily doped region flanking said gate structure, said heavily doped region supplanting an uncovered portion of said first lightly doped region, said second dosage N type conductivity-altering material being a greater dosage than said first dosage N type conductivity-altering material; and implanting said semiconductor substrate with a third dosage N type conductivity-altering material gradging said heavily doped region and remaining portion of said lightly doped region, said third dosage N type conductivity-altering material having a different diffusivity than said first dosage N type conductivity-altering material and said second dosage N type conductivity-altering material.

12. The method of claim 11, wherein said third dosage N type conductivity-altering material has greater diffusivity than said first dosage N type conductivity-altering material and said second dosage N type conductivity-altering material.

13. The method of claim 12, wherein said first dosage N type conductivity-altering material includes arsenic.

14. The method of claim 11, wherein said second dosage N type conductivity-altering material includes arsenic.

15. The method of claim 12, wherein said third dosage N type conductivity-altering material includes phosphorous.

16. The method of claim 11, wherein implanting the first dosage N type conductivity-altering material, implanting the second dosage N type conductivity-altering material, and implanting the third dosage N type conductivity-altering material are each self-aligning.

* * * * *

UNITED STATES PATENT AND TRADEMARK OFFICE
CERTIFICATE OF CORRECTION

PATENT NO. : 6,858,507 B2 Page 1 of 1
APPLICATION NO. : 10/198941
DATED : February 22, 2005
INVENTOR(S) : Aftab Ahmad and Charles Dennison It is certified that error appears in the above-identified patent and that said Letters Patent is hereby corrected as shown below:

On the title page:
In the section (56) References Cited, OTHER PUBLICATIONS insert --Grinolds et al., "Reliability and Performance of Submicron LDD NMOSFETS's with Buried-As n-Impurity Profiles," IEDM Tech., 1985, pp. 246-249.-- insert --Wei et al., "Buried and Graded/ Buried LDD Structures for Improved Hot-Electron Reliability," IEEE Device Letters, vol. EDL-7, June 1986, 3 pages.--

In the claims:
CLAIM 11,    COLUMN 7,    LINE 16,    change "gradging" to --grading--

Signed and Sealed this

Eleventh Day of September, 2007

JON W. DUDAS
*Director of the United States Patent and Trademark Office*